United States Patent
Doering et al.

(10) Patent No.: US 11,283,440 B2
(45) Date of Patent: Mar. 22, 2022

(54) CIRCUIT ARRANGEMENT AND POWER CONVERTER MODULE HAVING SEMICONDUCTOR SWITCHES CONNECTED IN SERIES

(71) Applicant: SIEMENS AKTIENGESELLSCHAFT, Munich (DE)

(72) Inventors: David Doering, Herzogenaurach (DE); Gerald Franz Giering, Kalchreuth (DE); Klaus Wuerflinger, Nuremberg (DE)

(73) Assignee: Siemens Energy Global GmbH & Co. KG, Munich (DE)

(*) Notice: Subject to any disclaimer, the term of this patent is extended or adjusted under 35 U.S.C. 154(b) by 0 days.

(21) Appl. No.: 17/045,232

(22) PCT Filed: Apr. 3, 2018

(86) PCT No.: PCT/EP2018/058457
§ 371 (c)(1),
(2) Date: Oct. 5, 2020

(87) PCT Pub. No.: WO2019/192675
PCT Pub. Date: Oct. 10, 2019

(65) Prior Publication Data
US 2021/0167769 A1 Jun. 3, 2021

(51) Int. Cl.
*H03K 17/10* (2006.01)
*H02M 1/096* (2006.01)

(52) U.S. Cl.
CPC .......... *H03K 17/107* (2013.01); *H02M 1/096* (2013.01); *H03K 2217/0081* (2013.01)

(58) Field of Classification Search
CPC ........ H03K 17/107; H03K 2217/0081; H02M 1/096
See application file for complete search history.

(56) References Cited

U.S. PATENT DOCUMENTS

| | | | |
|---|---|---|---|
| 9,680,464 B2 * | 6/2017 | Iwabuki | H01H 33/59 |
| 2011/0148368 A1 | 6/2011 | Burns et al. | |
| 2017/0012554 A1 * | 1/2017 | Pu | H02M 7/515 |
| 2018/0069543 A1 * | 3/2018 | Vershinin | H03K 17/0828 |

FOREIGN PATENT DOCUMENTS

| | | |
|---|---|---|
| DE | 202012012080 U1 | 3/2014 |
| WO | WO0223704 A1 | 3/2002 |

* cited by examiner

*Primary Examiner* — Patrick C Chen
(74) *Attorney, Agent, or Firm* — Laurence A. Greenberg; Werner H. Stemer; Ralph E. Locher

(57) ABSTRACT

A circuit arrangement has an even number of semiconductor switches, which are connected in series and contain in each case two load terminals and a control terminal and are associated with one another in pairs. The circuit arrangement also contains, for each semiconductor switch, a driver for actuating the semiconductor switch via the control terminal thereof and, for every two semiconductor switches that form a switch pair, contains a switching power supply which is supplied with energy from an electrical voltage between the two load terminals of a first semiconductor switch of the switch pair and supplies both the driver of the first semiconductor switch and the driver of the second semiconductor switch of the switch pair with energy.

11 Claims, 2 Drawing Sheets

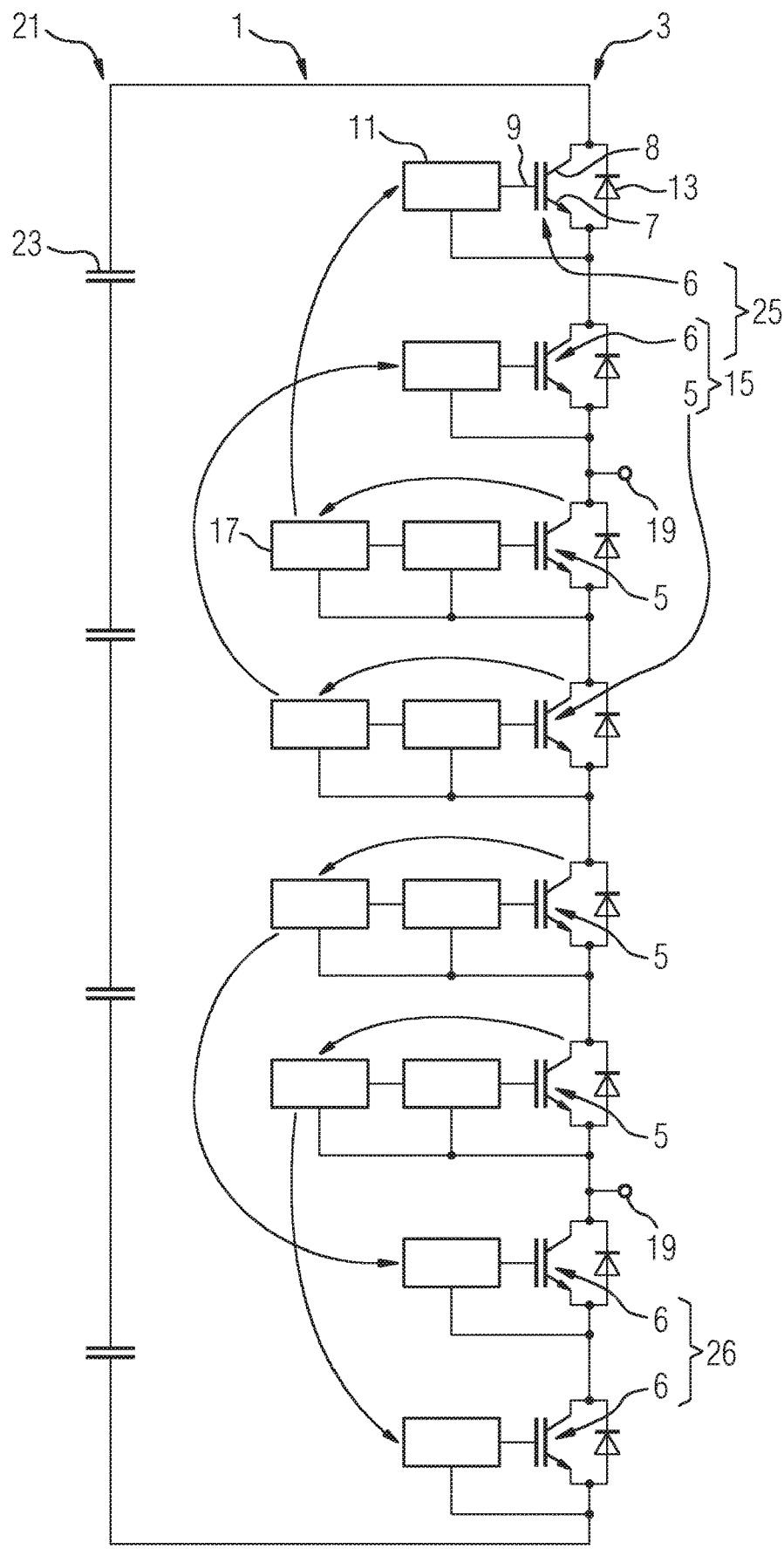

CIRCUIT ARRANGEMENT AND POWER CONVERTER MODULE HAVING SEMICONDUCTOR SWITCHES CONNECTED IN SERIES

BACKGROUND OF THE INVENTION

Field of the Invention

The invention relates to a circuit arrangement that has series-connected semiconductor switches, and to a converter module having such a circuit arrangement.

Semiconductor switches, such as an insulated-gate bipolar transistor (IGBT), are driven by a driver that needs to be supplied with electrical energy. Converter modules in particular often have a series circuit of semiconductor switches. The invention relates in particular to the supply of energy to the drivers of the semiconductor switches of such a series circuit. A driver of a single semiconductor switch is for example often supplied with energy from a capacitor connected to the semiconductor switch. This way of supplying energy to a driver of a semiconductor switch is however linked to difficulties in the case of a series circuit of semiconductor switches, since energy is coupled out either from a capacitor circuit for the entire series circuit of the semiconductor switches, and thus from a generally very high voltage, or from just one capacitor of a plurality of series-connected capacitors whose voltages are subject to fluctuations in terms of the voltage division between the capacitors.

SUMMARY OF THE INVENTION

The invention is based on the object of specifying a circuit arrangement and a converter module that have series-connected semiconductor switches and are improved in particular with regard to the supply of energy to the drivers of the semiconductor switches.

The object is achieved according to the invention by a circuit arrangement having the features of the first independent claim and a converter module having the features of the second independent claim.

Advantageous refinements of the invention are the subject matter of the dependent claims.

A circuit arrangement according to the invention comprises an even number of series-connected semiconductor switches that each have two load terminals and a control terminal and are assigned to one another in pairs, a driver for each semiconductor switch, for driving the semiconductor switch via the control terminal thereof and a switched-mode power supply for each two semiconductor switches forming a pair of switches, which switched-mode power supply is supplied with energy from an electrical voltage between the two load terminals of a first semiconductor switch of the pair of switches and supplies energy both to the driver of the first semiconductor switch and to the driver of the second semiconductor switch of the pair of switches.

The invention thus makes provision to supply energy to the drivers of series-connected semiconductor switches in pairs through a respective switched-mode power supply. The switched-mode power supply is supplied with energy by way of a voltage between the load terminals of a first semiconductor switch. In this case, a voltage that is present at the first semiconductor switch, in the switched-off state thereof, of a respective pair of switches is used to supply energy to the switched-mode power supply of the respective pair of switches, such that the abovementioned problems of an energy supply from a capacitor circuit do not arise.

One refinement of the invention makes provision for a freewheeling diode to be connected in parallel with each semiconductor switch. The semiconductor switches are thereby protected against overvoltages in the event of changes in their switching state.

In a further refinement of the invention, each semiconductor switch is an insulated-gate bipolar transistor whose load terminals are its emitter and its collector and whose control terminal is its gate. Each two successive semiconductor switches in the series circuit are in this case in particular electrically connected to one another by way of an electrical connection of the emitter of one of the two semiconductor switches and of the collector of the other of the two semiconductor switches. Insulated-gate bipolar transistors combine the advantages of bipolar transistors and field-effect transistors, and are therefore particularly suitable semiconductor switches, in particular for circuit arrangements for converter modules.

A further refinement of the invention makes provision for the semiconductor switches to be arranged stacked in the order of their series circuit (on top of one another or next to one another). This achieves a space-saving design of the circuit arrangement and allows easy interconnection of the semiconductor switches.

A further refinement of a circuit arrangement having at least four semiconductor switches makes provision for the first semiconductor switches of the pairs of switches to form a partial series circuit that is arranged between a first subset of second semiconductor switches of the pairs of switches and a second subset of second semiconductor switches of the pairs of switches in the series circuit of the semiconductor switches. The cardinal numbers of the two subsets of second semiconductor switches are in this case preferably the same in the case of an even number of pairs of switches and differ from one another by one in the case of an odd number of pairs of switches. Also preferably arranged between the two semiconductor switches of each pair of switches in the series circuit of the semiconductor switches is a number of semiconductor switches that is one less than the cardinal number of that subset of second semiconductor switches to which the second semiconductor switch of the pair of switches belongs. These refinements of the invention take into consideration that mutually corresponding load terminals of the two semiconductor switches of a pair of switches are at different electrical potentials from one another due to the series circuit of the semiconductor switches. This potential difference has to be compensated by the switched-mode power supply that supplies energy to the drivers of the two semiconductor switches. It is therefore advantageous to keep the potential difference between the two semiconductor switches of each pair of switches as small as possible. This is achieved by virtue of the abovementioned arrangement of the semiconductor switches, which achieves the smallest possible number of semiconductor switches of other pairs of switches connected between the two semiconductor switches of each pair of switches, wherein the first semiconductor switches form a partial series circuit.

A converter module according to the invention comprises a circuit arrangement according to one of the abovementioned refinements, a capacitor circuit connected to the two ends of the series circuit of the semiconductor switches and having at least one capacitor and two module terminals, which are end terminals of the partial series circuit formed by the first semiconductor switches of the pairs of switches. The capacitor circuit may in this case be a series circuit of a plurality of capacitors. The capacitor circuit may in particular have a number of capacitors that matches the number of pairs of switches of semiconductor switches. The advantages of a converter module according to the invention become apparent from the abovementioned advantages of the circuit arrangement.

The above-described properties, features and advantages of this invention and the way in which they are achieved will become clearer and more clearly comprehensible in connection with the following description of exemplary embodiments, which are explained in more detail in connection with the drawings.

BRIEF DESCRIPTION OF THE SEVERAL VIEWS OF THE DRAWING

FIG. 2 shows a converter module having eight series-connected semiconductor switches.

DETAILED DESCRIPTION OF THE INVENTION

Figure 1:
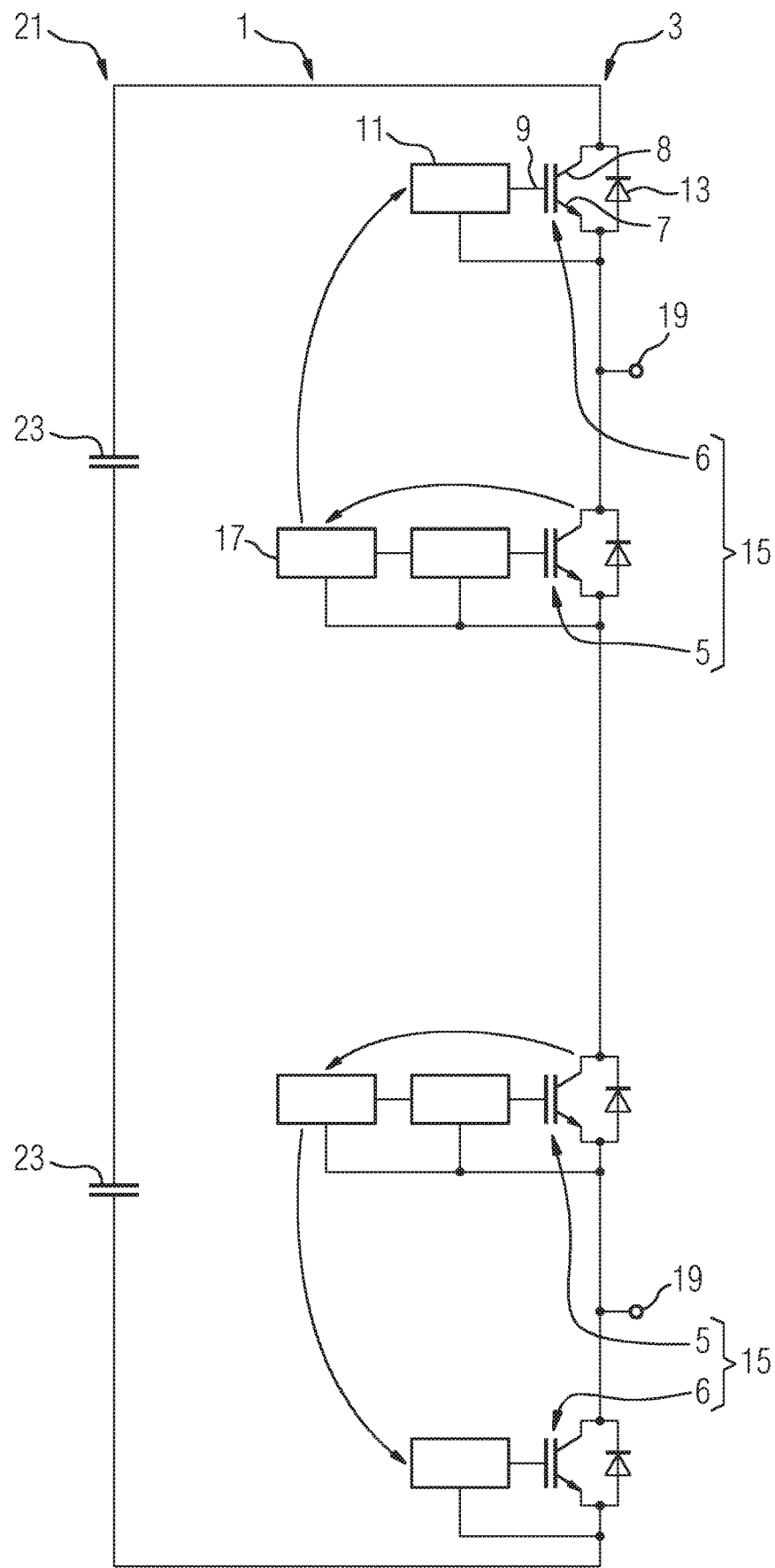
FIG. 1 shows a converter module having four series-connected semiconductor switches.

Mutually corresponding parts are provided with the same reference signs in the figures.

FIG. 1 shows a circuit diagram of a converter module 1 according to the invention having a circuit arrangement 3 according to the invention, which has four series-connected semiconductor switches 5, 6.

Each semiconductor switch 5, 6 is designed as an IGBT and has two load terminals 7, 8 (the emitter 7 and the collector 8) and a control terminal 9 (the gate). Each two successive semiconductor switches 5, 6 in the series circuit are electrically connected to one another by way of an electrical connection of the emitter 7 of one of the two semiconductor switches 5, 6 and of the collector 8 of the other of the two semiconductor switches 5, 6.

The circuit arrangement 3 furthermore has a driver 11 and a freewheeling diode 13 for each semiconductor switch 5, 6. The driver 11 drives the semiconductor switch 5, 6 via the control terminal 9. The freewheeling diode 13 is connected in parallel with the semiconductor switch 5, 6, wherein the anode of the freewheeling diode 13 is connected to the emitter 7 of the semiconductor switch 5, 6, and the cathode of the freewheeling diode 13 is connected to the collector 8 of the semiconductor switch 5, 6.

The semiconductor switches 5, 6 are assigned to one another in pairs and thus form two pairs of switches 15. The circuit arrangement 3 has a switched-mode power supply 17 for each pair of switches 15, which switched-mode power supply is supplied with energy from an electrical voltage between the two load terminals 7, 8 of a first semiconductor switch 5 of the pair of switches 15 and supplies energy both to the driver 11 of the first semiconductor switch 5 and to the driver 11 of the second semiconductor switch 6 of the pair of switches 15. The supply of energy to a switched-mode power supply 17 and to a second semiconductor switch 6 by a switched-mode power supply 17 are each indicated by an arrow.

The two first semiconductor switches 5 of the pairs of switches 15 form a partial series circuit that is arranged between the two second semiconductor switches 6 of the pairs of switches 15 in the series circuit of the semiconductor switches 5, 6, wherein the two semiconductor switches 5, 6 of each pair of switches 15 are arranged in succession.

The converter module 1 furthermore has two module terminals 19 and a capacitor circuit 21. The module terminals 19 are the end terminals of the partial series circuit formed by the first semiconductor switches 5 of the pairs of switches 15. The capacitor circuit 21 is connected to the two ends of the series circuit of the semiconductor switches 5, 6 and has two series-connected capacitors 23.

The semiconductor switches 5, 6 are arranged stacked on top of one another or next to one another in the order of their series circuit.

FIG. 2 shows a circuit diagram of a converter module 1 according to the invention having a circuit arrangement 3 according to the invention, which has eight series-connected semiconductor switches 5, 6.

Each semiconductor switch 5, 6 is designed as an IGBT and has two load terminals 7, 8 (the emitter 7 and the collector 8) and a control terminal 9 (the gate). Each two successive semiconductor switches 5, 6 in the series circuit are electrically connected to one another by way of an electrical connection of the emitter 7 of one of the two semiconductor switches 5, 6 and of the collector 8 of the other of the two semiconductor switches 5, 6.

The circuit arrangement 3 furthermore has a driver 11 and a freewheeling diode 13 for each semiconductor switch 5, 6. The driver 11 drives the semiconductor switches 5, 6 via the control terminal 9. The freewheeling diode 13 is connected in parallel with the semiconductor switch 5, 6, wherein the anode of the freewheeling diode 13 is connected to the emitter 7 of the semiconductor switch 5, 6, and the cathode of the freewheeling diode 13 is connected to the collector 8 of the semiconductor switch 5, 6.

The semiconductor switches 5, 6 are assigned to one another in pairs and thus form four pairs of switches 15. The circuit arrangement 3 has a switched-mode power supply 17 for each pair of switches 15, which switched-mode power supply is supplied with energy from an electrical voltage between the two load terminals 7, 8 of a first semiconductor switch 5 of the pair of switches 15 and supplies energy both to the driver 11 of the first semiconductor switch 5 and to the driver 11 of the second semiconductor switch 6 of the pair of switches 15. The supply of energy to a switched-mode power supply 17 and to a second semiconductor switch 6 by a switched-mode power supply 17 are each indicated by an arrow.

The four first semiconductor switches 5 of the pairs of switches 15 form a partial series circuit that is arranged between a first subset 25 of second semiconductor switches 6 of the pairs of switches 15 and a second subset 26 of second semiconductor switches 6 of the pairs of switches 15 in the series circuit of the semiconductor switches 5, 6, wherein each subset 25, 26 has two second semiconductor switches 6 and exactly one semiconductor switch 5, 6 of another pair of switches 15 is arranged between the two semiconductor switches 5, 6 of each pair of switches 15.

The converter module 1 furthermore has two module terminals 19 and a capacitor circuit 21. The module terminals 19 are the end terminals of the partial series circuit formed by the first semiconductor switches 5 of the pairs of switches 15.

The capacitor circuit 21 is connected to the two ends of the series circuit of the semiconductor switches 5, 6 and has four series-connected capacitors 23.

The semiconductor switches 5, 6 are arranged stacked on top of one another or next to one another in the order of their series circuit.

In the case of the two converter modules 1 shown in FIGS. 1 and 2, each switched-mode power supply 17 is designed to measure the voltage present between the two load terminals 7, 8 of the respective first semiconductor switch 5 and to couple energy out from this voltage when the first semiconductor switch 5 is switched off (in the off state). The switched-mode power supply 17 furthermore compensates a potential difference between the mutually corresponding load terminals 7, 8 (for example between the emitters 7) of the two semiconductor switches 5, 6 of the respective pair of switches 15. The arrangement of the two semiconductor switches 5, 6 of a pair of switches 15 next to one another in the case of the circuit arrangement 3 shown in FIG. 1 and the arrangement of the two semiconductor switches 5, 6 of a pair of switches 15 with in each case only one semiconductor switch 5, 6 of another pair of switches 15 arranged between the two semiconductor switches 5, 6 in the case of the circuit arrangement 3 shown in FIG. 2 each advantageously bring about a relatively low potential difference between the two semiconductor switches 5, 6 of a pair of switches 15.

There may furthermore be provision in the case of the two converter modules 1 shown in FIGS. 1 and 2, in addition to the supply of energy to the switched-mode power supply 17 from voltages present at the first semiconductor switches 5, to allow a redundant supply of energy to the switched-mode power supplies 17, for example from a current or the capacitor circuit 21, which may be used when required.

Although the invention has been described and illustrated in more detail through preferred exemplary embodiments, the invention is not restricted by the disclosed examples, and other variations may be derived therefrom by a person skilled in the art without departing from the scope of protection of the invention.

LIST OF REFERENCE SIGNS 1 converter module
3 circuit arrangement
5, 6 semiconductor switch
7, 8 load terminal
9 control terminal
11 driver
13 freewheeling diode
15 pair of switches
17 switched-mode power supply
19 module terminal
21 capacitor circuit
23 capacitor
25, 26 subset

The invention claimed is:

1. A circuit configuration, comprising:
an even number of series-connected semiconductor switches, each of said semiconductor switches having two load terminals and a control terminal, and said semiconductor switches are assigned to one another in pairs;
drivers, each of said semiconductor switches being driven by one of said drivers via said control terminal; and
switched-mode power supplies;
wherein said series-connected semiconductor switches form a plurality of pairs of semiconductor switches that each include a first semiconductor switch and a second semiconductor switch, and each one of said plurality of pairs of semiconductor switches are driven by a respective one of said switched-mode power supplies;
wherein each one of said switched-mode power supplies is supplied with energy from an electrical voltage between said two load terminals of said first semiconductor switch of a respective one of said plurality of pairs of switches, and said one of said switched-mode power supplies is configured to supply energy both to said driver of said first semiconductor switch and to said driver of said second semiconductor switch of the respective one of said plurality of pairs of switches;
wherein a first pair of switches is formed by two of said series-connected semiconductor switches and a second pair of switches is formed by another two of said series-connected switches;
wherein said first pair of switches is driven by one of said switched-mode power supplies and said second pair of switches is driven by another one of said switched mode power-supplies; and
wherein said first semiconductor switch of said first pair of switches and said second semiconductor switch of said first pair of switches are connected in series with each other by said first semiconductor switch or said second semiconductor switch of said second pair of switches.

2. The circuit configuration according to claim 1, further comprising freewheeling diodes, one of said freewheeling diodes connected in parallel with each of said semiconductor switches.

3. The circuit configuration according to claim 1, wherein each of said semiconductor switches is an insulated-gate bipolar transistor, said load terminals include an emitter and a collector, and said control terminal is a gate.

4. The circuit configuration according to claim 3, wherein each two successive said semiconductor switches in a series circuit are electrically connected to another by way of an electrical connection of said emitter of one of said two successive semiconductor switches and of said collector of another of said two successive semiconductor switches.

5. The circuit configuration according to claim 3, wherein said semiconductor switches are disposed stacked in an order of said series circuit.

6. The circuit configuration according to claim 1, wherein the circuit configuration has at least four said semiconductor switches, wherein first semiconductor switches of said pairs of switches form a partial series circuit that is disposed between a first subset of second semiconductor switches of said pairs of switches and a second subset of said second semiconductor switches of said pairs of switches in a series circuit of said semiconductor switches.

7. The circuit configuration according to claim 6, wherein cardinal numbers of said first and second subsets of said second semiconductor switches are a same in a case of an even number of said pairs of switches and differ from one another by one in a case of an odd number of said pairs of switches.

8. The circuit configuration according to claim 6, wherein disposed between said two semiconductor switches of each of said pair of switches in said series circuit of said semiconductor switches is a number of said semiconductor switches that is one less than the cardinal number of a subset that is selected from the group consisting of said first and second subsets of said second semiconductor switches to which said second semiconductor switch of said pair of switches belongs.

9. A converter module, comprising:
a circuit configuration according to claim 6;
a capacitor circuit connected to two ends of said series circuit of said semiconductor switches and having at least one capacitor; and
two module terminals, which are end terminals of said partial series circuit formed by said first semiconductor switches of said pairs of switches.

10. The converter module according to claim 9, wherein said capacitor circuit is a series circuit of a plurality of capacitors.

11. The converter module according to claim 10, wherein said capacitor circuit has a number of capacitors that matches a number of said pairs of switches of said circuit configuration.

* * * * *